(12) United States Patent
Lee

(10) Patent No.: US 9,269,419 B2
(45) Date of Patent: Feb. 23, 2016

(54) SEMICONDUCTOR MEMORY DEVICE AND SEMICONDUCTOR SYSTEM INCLUDING THE SAME

(71) Applicant: SK hynix Inc., Gyeonggi-do (KR)

(72) Inventor: Geun-Il Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 148 days.

(21) Appl. No.: 14/106,803

(22) Filed: Dec. 15, 2013

(65) Prior Publication Data

US 2015/0098282 A1     Apr. 9, 2015

(30) Foreign Application Priority Data

Oct. 7, 2013  (KR) .................. 10-2013-0119167

(51) Int. Cl.
| | |
|---|---|
| *G11C 7/00* | (2006.01) |
| *G11C 11/4076* | (2006.01) |
| *G11C 7/10* | (2006.01) |
| G11C 11/4096 | (2006.01) |
| G11C 11/4097 | (2006.01) |

(52) U.S. Cl.
CPC .......... *G11C 11/4076* (2013.01); *G11C 7/1018* (2013.01); *G11C 11/4096* (2013.01); *G11C 11/4097* (2013.01); *G11C 2207/107* (2013.01)

(58) Field of Classification Search
CPC ...... G11C 7/22; G11C 7/1066; G11C 7/1042; G11C 7/1051
USPC ....................... 365/193, 63, 230.04
See application file for complete search history.

(56) References Cited

U.S. PATENT DOCUMENTS

2011/0035644 A1*  2/2011  Madan .......................... 714/758

FOREIGN PATENT DOCUMENTS

KR          100362193        11/2002

* cited by examiner

*Primary Examiner* — Huan Hoang
(74) *Attorney, Agent, or Firm* — IP & T Group LLP

(57) ABSTRACT

Disclosed herein is a semiconductor memory device using a pre-fetch method and a semiconductor system including the same. The semiconductor memory device may include a memory bank having an odd-numbered array region suitable for inputting/outputting data through N first local lines in response to an odd-numbered column address, and an even-numbered array region suitable for inputting/outputting data through N second local lines in response to an even-numbered column address, N being a positive integer, a column address generation unit suitable for consecutively generating the odd-numbered column address and the even-numbered column address whose generation sequence is controlled depending on whether an external column address has an even-numbered value or an odd-numbered value, and N global lines coupled in common to the N first local lines and the N second local lines, suitable for inputting/outputting data.

18 Claims, 7 Drawing Sheets

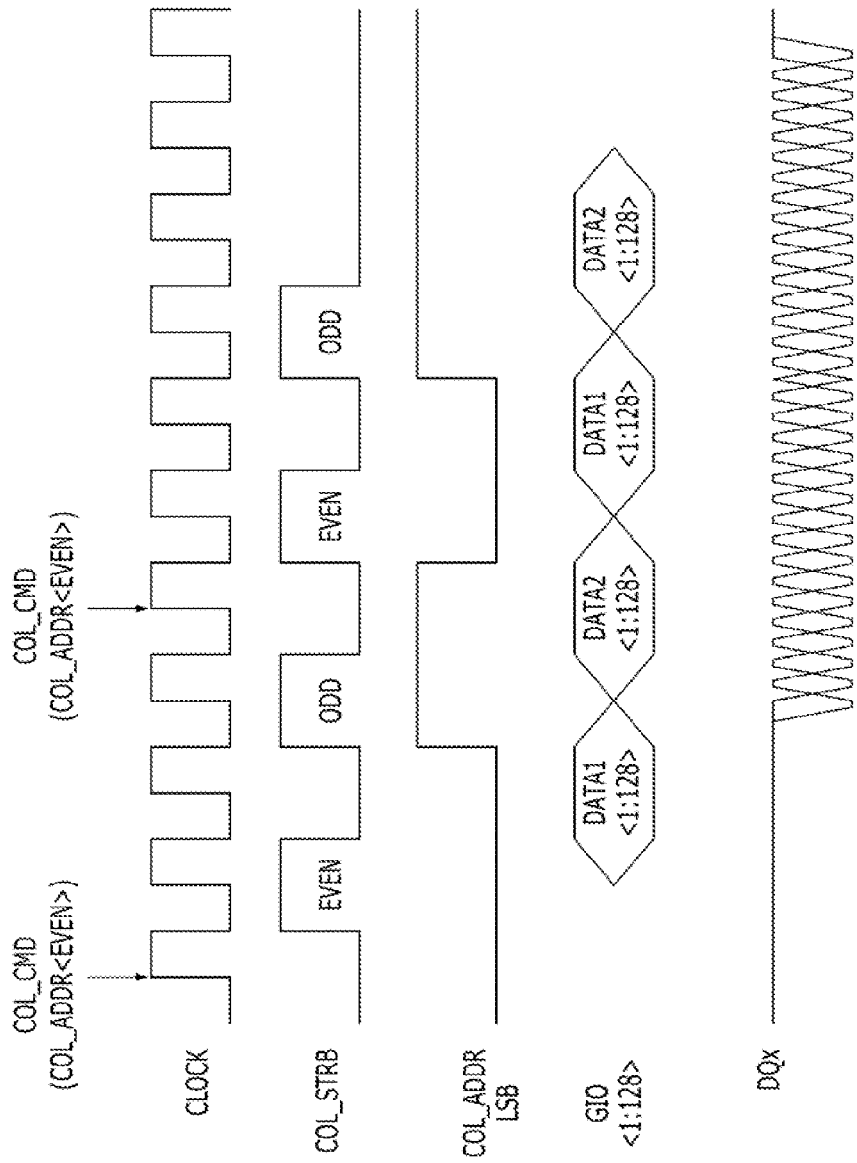

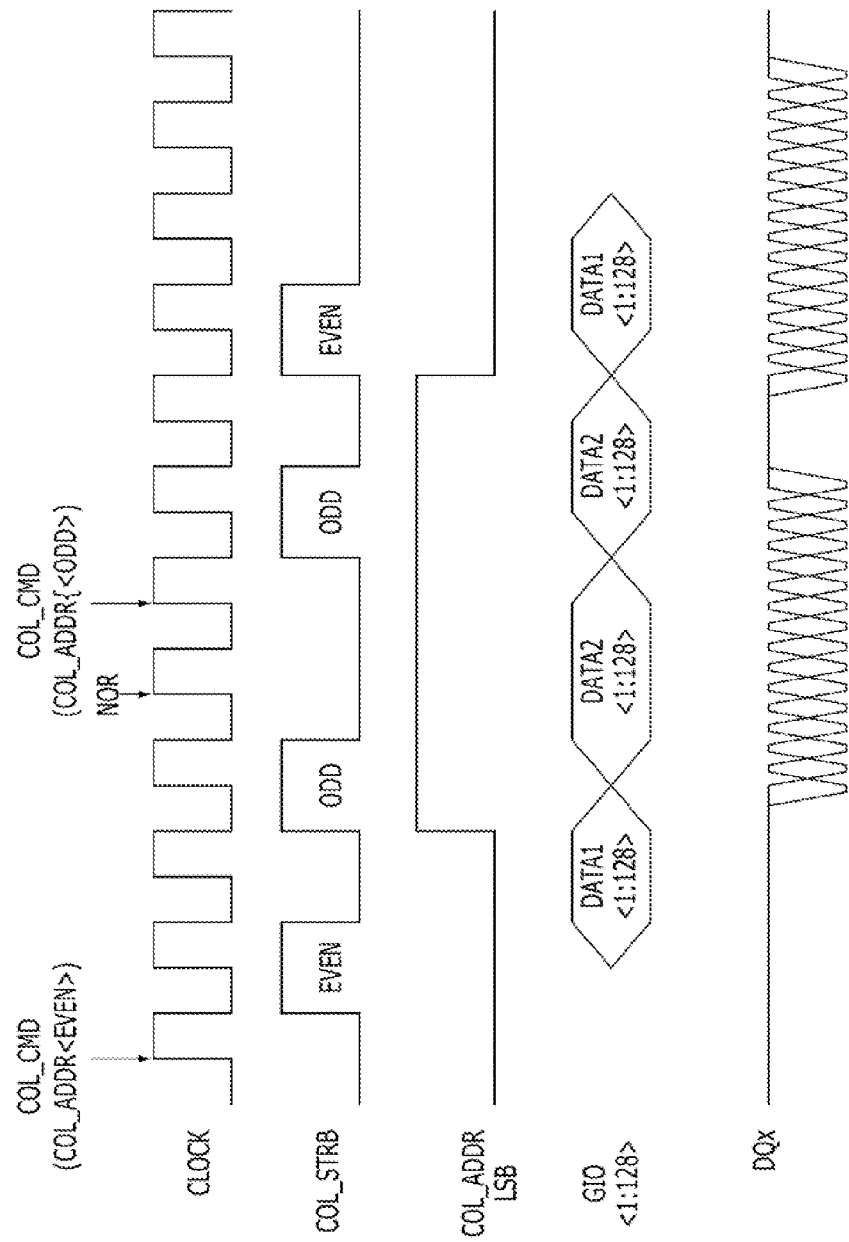

SEMICONDUCTOR MEMORY DEVICE AND SEMICONDUCTOR SYSTEM INCLUDING THE SAME

CROSS-REFERENCE TO RELATED APPLICATIONS

The present application claims priority of Korean Patent Application No. 10-2013-0119167, filed on Oct. 7, 2013, which is incorporated herein by reference in its entirety.

BACKGROUND

1. Field

Exemplary embodiments of the present invention relate to semiconductor design technology, and more particularly, to a semiconductor memory device using a pre-fetch method and a semiconductor system including the same.

2. Description of the Related Art

Generally, a data input/output (I/O) of a synchronous semiconductor memory device is performed in synchronization with an internal clock signal that is generated based on an external clock signal. Examples of synchronous semiconductor memory devices include single data rate (SDR) synchronous dynamic random access memory (SDRAM), double data rate (DDR) SDRAM, DDR2 SDRAM, DDR3 SDRAM, and graphic DDR5 (GDDR5) SDRAM. The devices DDR, DDR2, DDR3 SDRAM, and GDDR5 SDRAM are multi-bit pre-fetch type semiconductor memory devices. For example, an 8-bit pre-fetch scheme is used in DDR3 SDRAM and GDDR5 SDRAM. In the 8-bit pre-fetch scheme, whenever a column command is generated in a semiconductor memory device, 8-bit data are outputted to an external device in series through one data I/O pin for 4 cycles of an operation clock.

It is expected that a 16-bit pre-fetch scheme will be applied to the next-generation semiconductor memory devices, such as a Mobile DDR4 that is being developed.

FIG. 1 is a block diagram illustrating a conventional semiconductor memory device to which an 8-bit pre-fetch scheme has been applied. FIG. 2 is a block diagram illustrating a conventional semiconductor memory device to which a 16-bit pre-fetch scheme has been applied.

Referring to FIGS. 1 and 2, the conventional semiconductor memory device include a memory bank 10, an address decoder 20, a data I/O unit 30, a command decoder 40, 16 data I/O pads DQ<1:16>, a column operation region 60, and a row operation region 50, irrespective of whether an 8-bit pre-fetch scheme or a 16-bit pre-fetch scheme is applied to the conventional semiconductor memory device. The memory bank 10 includes an upper memory region 10<UP> and a lower memory region 10<DN>. The data I/O unit 30 includes an upper data I/O unit 30<UP> and a lower data I/O unit 30<DN>. The command decoder 40 includes a column command decoder (not shown) and a row command decoder (not shown). The address decoder 20 includes a column address decoder (not shown) and a row address decoder (not shown). Furthermore, in the semiconductor memory device of FIGS. 1 and 2, the row operation region 50 performs an operation for selecting a word line of the memory bank 10 in response to a row command ROW_CMD generated from the row command decoder 40 and a row address ROW_ADDR generated from the row address decoder 20. Furthermore, the column operation region 60 performs an operation for selecting a bit line of the memory bank 10 in response to a column command COL_CMD generated from the row command decoder 40 and a column address COL_ADDR generated from the row address decoder 20.

First, when utilizing the 8-bit pre-fetch scheme, the memory bank 10 and the column operation region 60 of FIG. 1 input/output 16 8-bit data DATA1<1:8>, DATA2<1:8>, DATA3<1:8>, . . . , DATA15<1:8>, and DATA16<1:8> through the respective 16 data I/O pads DQ<1:16> at the same time. That is, when the column command COL_CMD and the column address COL_ADDR are applied, the memory bank 10 and the column operation region 60 input/output 128 data DATA<1:128> in parallel. The lower memory region 10<DN> of the memory bank 10 inputs/outputs 64 data DATA<1:64> from/to a lower 8 data I/O pads DQ<1:8> of the 16 data I/O pads DQ<1:16>. Similarly, the upper memory region 10<UP> of the memory bank 10 inputs/outputs 64 data DATA<65:128> from/to an upper 8 data I/O pads DQ<9:16> of the 16 data I/O pads DQ<1:16>.

The 128 data DATA<1:128> that are inputted to or outputted from the memory bank 10 are subject to serial-to-parallel conversion by the data I/O unit 30 through 128 local lines LIO<1:128> and 128 global lines GIO<1:128> and are then inputted to or outputted from the 16 data I/O pads DQ<1:16>. That is, the 128 data DATA<1:128> that need to be outputted from the memory bank 10 to the 16 data I/O pads DQ<1:16> are transferred to the data I/O unit 30 through the 128 local lines LIO<1:128> and the 128 global lines GIO<1:128>, serialized by the data I/O unit 30 by 8 bits, and then outputted to the 16 data I/O pads DQ<1:16>. In contrast, the 128 data DATA<1:128> that need to be transferred from the 16 data I/O pads DQ<1:16> to the memory bank 10 are inputted to the 16 data I/O pads DQ<1:16> by 8 bits in series, parallelized by the data I/O unit 30, and then transmitted to the memory bank 10 through the 128 global lines GIO<1:128> and the 128 local lines LIO<1:128>.

Furthermore, the upper data I/O unit 30<UP> of the data I/O unit 30 performs serial-to-parallel or parallel-to-serial conversion on the 64 data DATA<1:64> between the upper 8 data I/O pads DQ<9:16> and the upper memory region 10<UP> and inputs/outputs the converted 64 data DATA<1:64>. Furthermore, the lower data I/O unit 30<DN> of the data I/O unit 30 performs serial-to-parallel or parallel-to-serial conversion on the 64 data DATA<65:128> between the lower 8 data I/O pads DQ<1:8> and the lower memory region 10<DN> and inputs/outputs the converted 64 data DATA<65:128>.

The command decoder 40 generates the column command COL_CMD by decoding an external command CMD and transfers the column command COL_CMD to the column operation region 60 to perform column data I/O operations.

The address decoder 20 generates the column address COL_ADDR by decoding an external address ADD and transfers the column address COL_ADDR to the column operation region 60 to select the 128 data DATA<1:128> to be used in I/O operations from the memory bank 10.

When utilizing the 16-bit pre-fetch scheme, the memory bank 10 and the column operation region 60 of FIG. 2 input/output 16 16-bit data DATA1<1:16>, DATA2<1:16>, DATA3<1:16>, . . . , DATA15<1:16>, and DATA16<1:16> through the respective 16 data I/O pads DQ<1:16>, at the same time. That is, when the column command COL_CMD and the column address COL_ADDR are applied, the memory bank 10 and the column operation region 60 input/output 256 data DATA<1:256> in parallel. The lower memory region 10<DN> of the memory bank 10 inputs/outputs the 128 data DATA<1:128> from/to a lower 8 data I/O pads DQ<1:8> of the 16 data I/O pads DQ<1:16>. Similarly, the upper memory region 10<UP> of the memory bank 10 inputs/outputs the 128 data DATA<129:256> from/to an upper 8 data I/O pads DQ<9:16> of the 16 data I/O pads DQ<1:16>.

The 256 data DATA<1:256> inputted to or outputted from the memory bank 10 are subject to serial-to-parallel conversion by the data I/O unit 30 through 256 local lines LIO<1: 256> and 256 global lines GIO<1:256> and are inputted to or outputted from the 16 data I/O pads DQ<1:16>. That is, the 256 data DATA<1:256> to be outputted from the memory bank 10 to the 16 data I/O pads DQ<1:16> are transferred to the data I/O unit 30 through the 256 local lines LIO<1:256> and the 256 global lines GIO<1:256>, serialized by the data I/O unit 30 by 16 bits, and then outputted to the 16 data I/O pads DQ<1:16>. In contrast, the 256 data DATA<1:256> to be transferred from the 16 data I/O pads DQ<1:16> to the memory bank 10 are inputted to the 16 data I/O pads DQ<1: 16> by 16 bits in series, parallelized by the data I/O unit 30, and then transmitted to the memory bank 10 through the 256 global lines GIO<1:256> and the 256 local lines LIO<1: 256>.

Furthermore, the upper data I/O unit 30<UP> of the data I/O unit 30 performs serial-to-parallel or parallel-to-serial conversion on the 128 data DATA<1:128> between the upper 8 data I/O pads DQ<9:16> and the upper memory region 10<UP> and inputs/outputs the converted 128 data DATA<1: 128>. The lower data I/O unit 30<DN> of the data I/O unit 30 performs serial-to-parallel or parallel-to-serial conversion on the 128 data DATA<129:256> between the lower 8 data I/O pads DQ<1:8> and the lower memory region 10<DN> and inputs/outputs the converted 128 data DATA<129:256>.

The command decoder 40 generates the column command COL_CMD by decoding an external command CMD and transfers the generated column command COL_CMD to the column operation region 60 to perform column data I/O operations.

The address decoder 20 generates the column address COL_ADDR by decoding an external address ADD and transfers the generated column address COL_ADDR to the column operation region 60 to select the 256 data DATA<1: 256> to be used in I/O operations from the memory bank 10.

As described above, when applying the 16-bit pre-fetch scheme to the semiconductor memory device of FIG. 2, the total of the 256 local lines LIO<1:256> and the 256 global lines GIO<1:256> are necessary since the 16 data DATA1<1: 16>, DATA2<1:16>, DATA3<1:16>, ..., DATA15<1:16>, and DATA16<1:16> are outputted through the respective 16 data I/O pads DQ<1:16>. However, when applying the 8-bit pre-fetch scheme to the semiconductor memory device of FIG. 1, only the total of the 128 local lines LIO<1:128> and the 128 global lines GIO<1:128> are necessary because the 8 data DATA1<1:8>, DATA2<1:8>, DATA3<1:8>, ..., DATA15<1:8>, and DATA16<1:8> are inputted/outputted through the respective 16 data I/O pads DQ<1:16>. That is, the number of local lines and global lines that are necessary for the 16-bit pre-fetch scheme is two times greater than the number of local lines and global lines that are necessary for the 8-bit pre-fetch scheme. Accordingly, when the 16-bit pre-fetch scheme is applied to a semiconductor memory device using the 8-bit pre-fetch scheme, the number of data lines within the semiconductor memory device is increased two times. As a result, there are concerns that the net die of the semiconductor memory device is reduced and current consumption is increased due to an increase in the number of parallel bits to be processed at the same time.

SUMMARY

Various exemplary embodiments are directed to a semiconductor memory device capable of stably supporting a 16-bit pre-fetch scheme by minimizing an increase of an area, and a semiconductor system including the same.

In an exemplary embodiment according to the present invention, a semiconductor memory device may include a memory bank having an odd-numbered array region suitable for inputting/outputting data through N first local lines in response to an odd-numbered column address, and an even-numbered array region suitable for inputting/outputting data through N second local lines in response to an even-numbered column address, N being a positive integer, a column address generation unit suitable for consecutively generating the odd-numbered column address and the even-numbered column address whose generation sequence is controlled depending on whether an external column address has an even-numbered value or an odd-numbered value, and N global lines coupled to the N first local lines and the N second local lines in common, and suitable for inputting/outputting data.

In an exemplary embodiment, a semiconductor system may include a semiconductor memory device including M data pads and suitable for inputting/outputting 2*N data serialized for each of the M data pads whenever an external column command and an external column address are received, N and M being positive integers, and a semiconductor controller suitable for controlling an operation of the semiconductor memory device by generating and transferring the external column command and the external column address to the semiconductor memory device. The semiconductor memory device may include a memory bank having an odd-numbered array region suitable for inputting/outputting data through M*N first local lines in response to an odd-numbered column address and an even-numbered array region suitable for inputting/outputting data through M*N second local lines in response to an even-numbered column address, a column address generation unit for consecutively generating the odd-numbered and even-numbered column addresses whose generation sequence is controlled depending on whether the external column address has an even-numbered value or an odd-numbered value, and M*N global lines coupled to the M*N first local lines and the M*N second local lines in common, suitable for inputting/outputting data, wherein the M*N global lines are separated by N data and coupled to the M data pads.

BRIEF DESCRIPTION OF THE DRAWINGS

FIGS. 6A and 6B are timing diagrams illustrating operations of the semiconductor system of FIG. 5.

DETAILED DESCRIPTION

Figure 1:
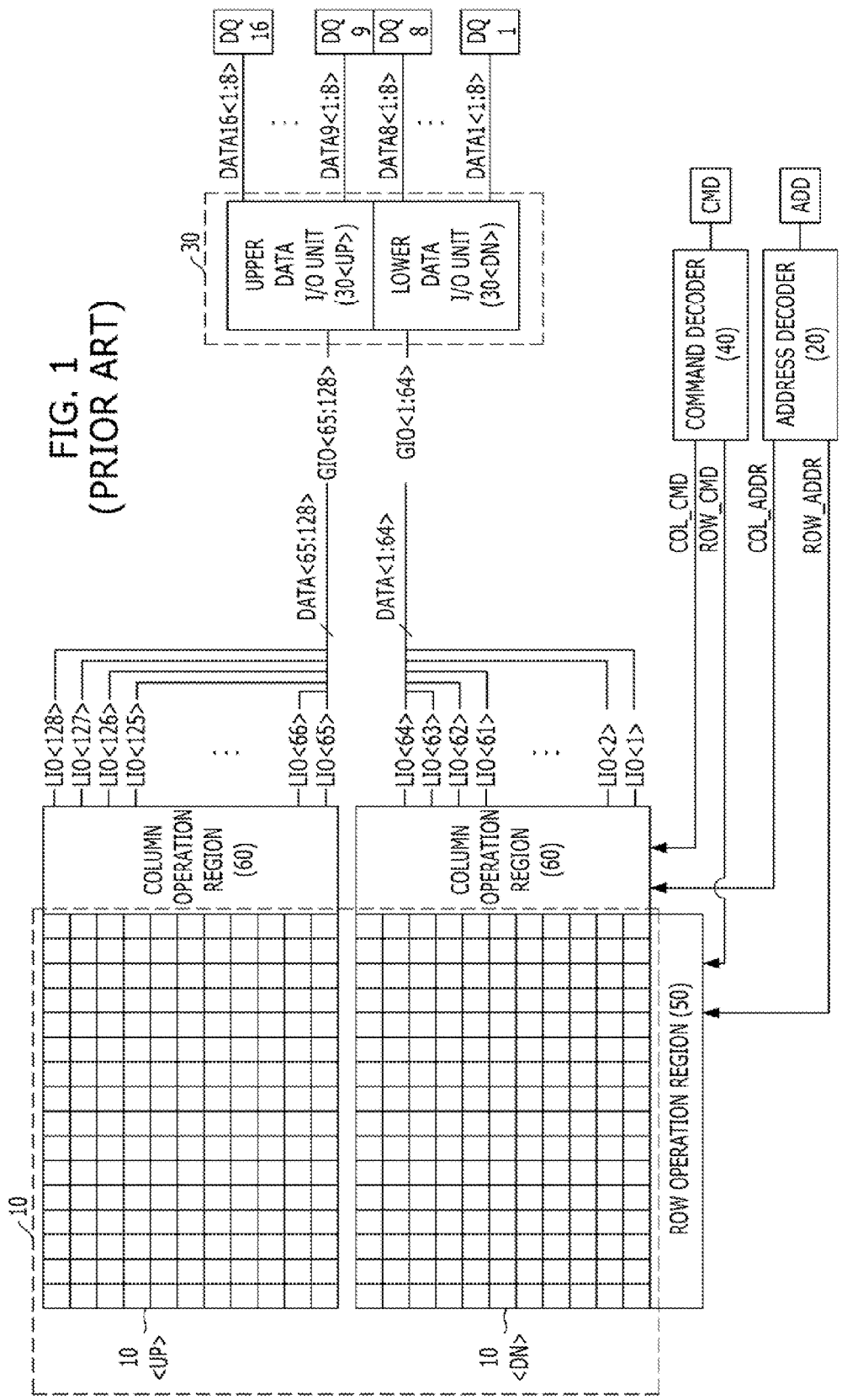
FIG. 1 is a block diagram illustrating a conventional semiconductor memory device to which an 8-bit pre-fetch scheme has been applied.
Figure 2:
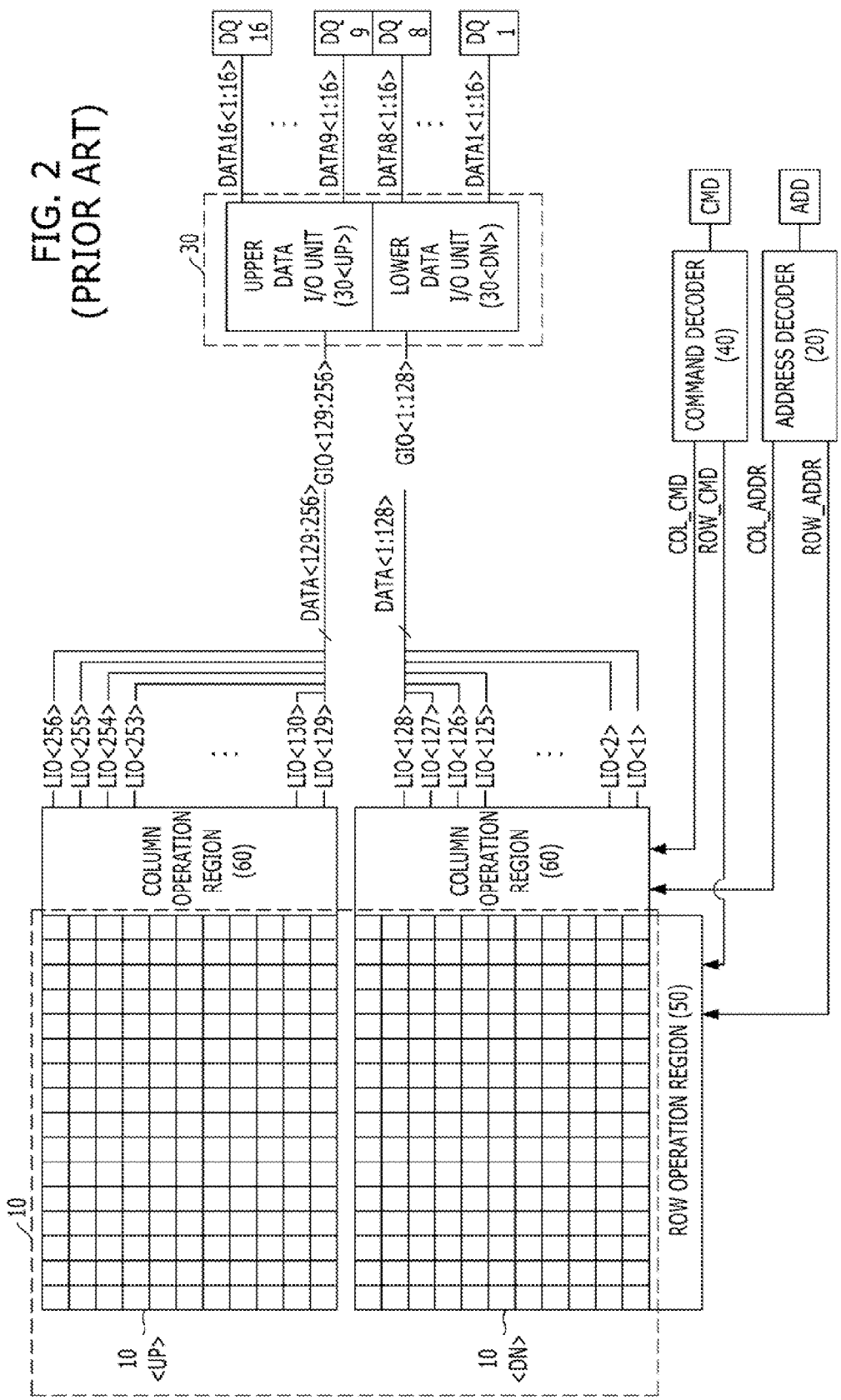
FIG. 2 is a block diagram illustrating a conventional semiconductor memory device to which a 16-bit pre-fetch scheme has been applied.

Various exemplary embodiments will be described below in more detail with reference to the accompanying drawings.

The present invention may, however, be embodied in different forms and should not be construed as limited to the embodiments set forth herein. Rather, these embodiments are provided so that this disclosure will be thorough and complete, and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
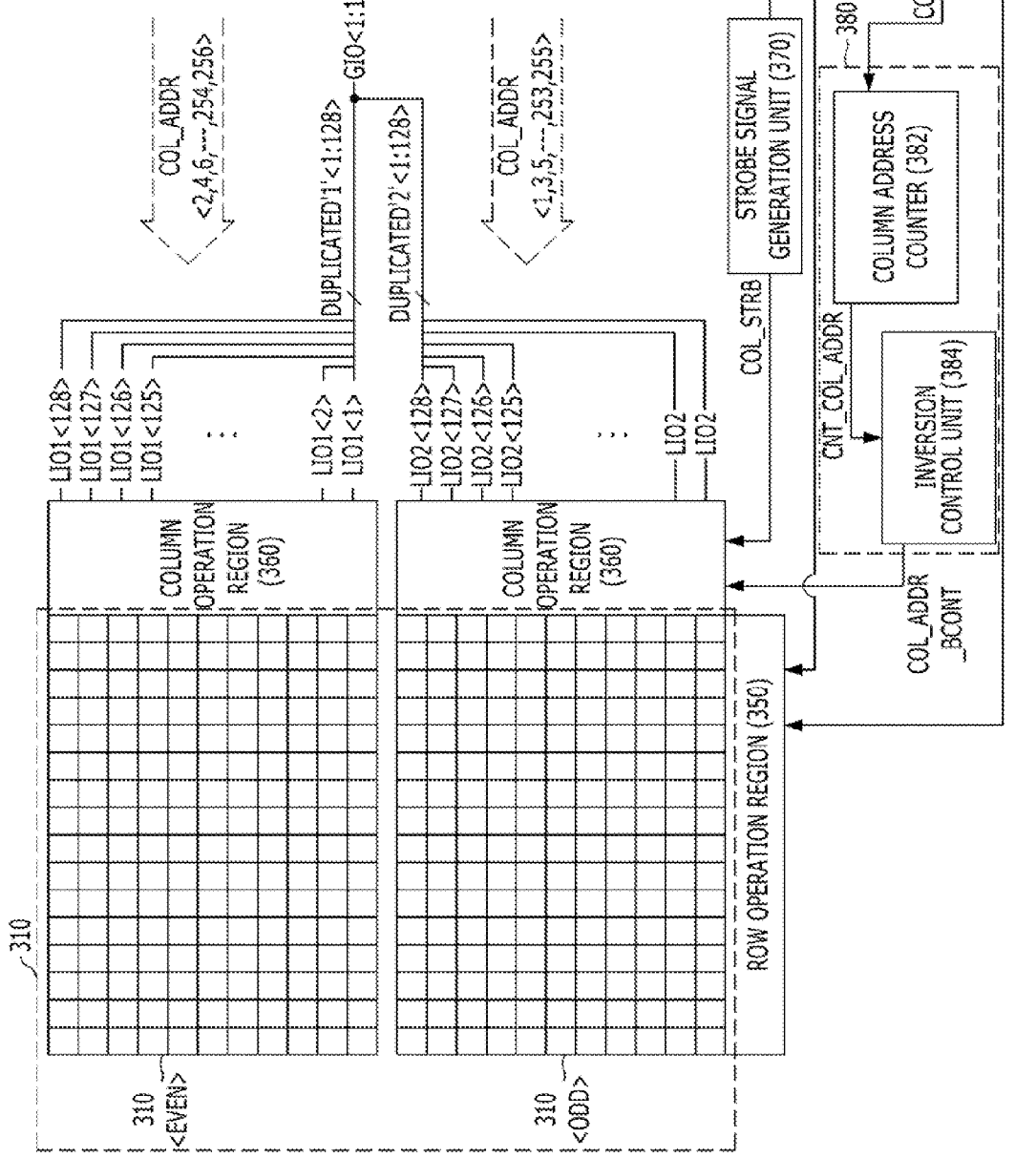
FIG. 3 is a block diagram illustrating a semiconductor memory device to which a 16-bit pre-fetch scheme has been applied in accordance with an exemplary embodiment of the present invention.

FIG. 3 is a block diagram illustrating a semiconductor memory device to which a 16-bit pre-fetch scheme has been applied in accordance with an exemplary embodiment of the present invention.

Referring to FIG. 3, the semiconductor memory device to which a 16-bit pre-fetch scheme has been applied in accordance with the exemplary embodiment of the present invention includes a memory bank 310, an address decoder 320, a data input unit 332, a data output unit 334, a command decoder 340, 16 data I/O pads DQ<1:16>, a column operation region 360, a row operation region 350, a strobe signal generation unit 370, and a column address output unit 380. The memory bank 310 includes an odd-numbered array region 310<ODD> and an even-numbered array region 310<EVEN>. The semiconductor memory device further includes 128 first local lines LIO1<1:128>, 128 second local lines LIO2<1:128>, and 128 global lines GIO<1:128>. The command decoder 340 includes a column command decoder 342 and a row command decoder 344. The address decoder 320 includes a column address decoder 322 and a row address decoder 324. The column address output unit 380 includes a column address counter 382 and an inversion control unit 384. Both the column address decoder 322 and the column address output unit 380 are for processing a column address and may be collectively indicated by a column address generation unit (322, 380). Furthermore, in the semiconductor memory device of FIG. 3, the row operation region 350 performs an operation for selecting a word line of the memory bank 310 in response to a row command ROW_CMD generated from the row command decoder 344 and a row address ROW_ADDR generated from the row address decoder 324.

The memory bank 310 includes the odd-numbered array region 310<ODD> to input/output data DATA2<1:128> through the 128 second local lines LIO2<1:128> in response to odd-numbered column addresses COL_ADDR<1, 3, . . . , 255> and the even-numbered array region 310<EVEN> to input/output data DATA1<1:128> through the 128 first local lines LIO1<1:128> in response to even-numbered column addresses COL_ADDR<2, 4, . . . , 256>. It can be seen that a total of 256 local lines are present because the number of first local lines LIO1<1:128> for inputting or outputting the data DATA1<1:128> of the even-numbered array region 310<EVEN> is 128 and the number of second local lines LIO2<1:128> for inputting or outputting the data DATA2<1:128> of the odd-numbered array region 310<ODD> is 128. Accordingly, the memory bank 310 has a construction that supports a 16-bit pre-fetch scheme.

Furthermore, the 128 global lines GIO<1:128> are coupled in common to the 128 first local lines LIO1<1:128> and the 128 second local lines LIO2<1:128>, and data are inputted/outputted between the 128 global lines GIO<1:128> and the 16 data I/O pads DQ<1:16> through the data input unit 332 and the data output unit 334. The construction in which the 128 global lines GIO<1:128> output or input data through the 16 data I/O pads DQ<1:16> is the same as that of the 8-bit pre-fetch scheme shown in FIG. 1.

As described above, the memory bank 310 supports a 16-bit pre-fetch scheme, whereas the data input unit 332 and the data output unit 334 supports only an 8-bit pre-fetch scheme. Nevertheless, the overall operation of the semiconductor memory device may support the 16-bit pre-fetch scheme according to the following design.

First, the odd-numbered array region 310<ODD> and the even-numbered array region 310<EVEN> of the memory bank 310 independently support respective 8-bit pre-fetch schemes. That is, the 128 data DATA1<1:128> to be inputted/outputted in series through the 16 data I/O pads DQ<1:16> by 8 bits may be inputted/outputted only in the odd-numbered array region 310<ODD>. Similarly, the 128 data DATA2<1:128> inputted/outputted in series through the 16 data I/O pads DQ<1:16> by 8 bits may be inputted/outputted only in the even-numbered array region 310<EVEN>.

Furthermore, the 128 first local lines LIO1<1:128> and the 128 second local lines LIO2<1:128> are coupled in common to the 128 global lines GIO<1:128>. An element for selecting the input/output of data, such as a multiplexer, is not included between the 128 global lines GIO<1:128> and the 128 first local lines LIO1<1:128> and between the 128 global lines GIO<1:128> the 128 second local lines LIO2<1:128>. That is, the 128 global lines GIO<1:128> may input/output the data DATA1<1:128> of the 128 first local lines LIO1<1:128> and input/output the data DATA2<1:128> of the 128 second local lines LIO2<1:128>. For the data DATA1<1:128> of the 128 first local lines LIO1<1:128> and the data DATA2<1:128> of the 128 second local lines LIO2<1:128> not to collide with each other in the 128 global lines GIO<1:128>, the odd-numbered array region 310<ODD> and the even-numbered array region 310<EVEN> of the memory bank 310 perform data I/O operations at different timings. For example, the memory bank 310, the column address output unit 380 and the strobe signal generation unit 370 may operate as follows.

The column address generation unit (322, 380) includes the column address decoder 322 to generate an internal column address COL_ADDR by decoding an external address ADD and the column address output unit 380 to generate the odd-numbered column addresses COL_ADDR<1, 3, . . . , 255> and the even-numbered column addresses COL_ADDR<2, 4, . . . , 256> whose generation sequence is controlled depending on whether the internal column address COL_ADDR generated from the column address decoder 322 has an even-numbered value or an odd-numbered value. When the internal column address COL_ADDR generated from the column address decoder 322 has an even-numbered value, the column address output unit 380 outputs the internal column address COL_ADDR without change so that the even-numbered column addresses COL_ADDR<2, 4, . . . , 256> are outputted, inverts the least significant bit "LSB" 1 bit of the internal column address COL_ADDR at a point in time at which the output of the even-numbered column addresses COL_ADDR<2, 4, . . . , 256> is finished, and outputs the odd-numbered column addresses COL_ADDR<1, 3, . . . , 255>. Similarly, when the internal column address COL_ADDR generated from the column address decoder 322 has an odd-numbered value, the column address output unit 380 outputs the internal column address COL_ADDR without change so that the odd-numbered column addresses COL_ADDR<1, 3, . . . , 255> are outputted, inverts the LSB 1 bit of the internal column address COL_ADDR at a point in time at which the output of the odd-numbered column addresses COL_ADDR<1, 3, . . . , 255> is finished, and outputs the even-numbered column addresses COL_ADDR<2, 4, . . . , 256>.

The column address output unit 380 includes the column address counter 382 to output a counting address CNT_COL_ADDR by repeatedly counting each of the remaining 7 bits except for the LSB 1 bit of the internal column address COL_ADDR, generated from the column address decoder 322, 128 times, and the inversion control unit 384 to invert the LSB 1 bit of the counting address CNT_COL_ADDR, generated from the column address counter 382, in response to the completion of the $128^{th}$ counting operation of the column address counter 382 after the internal column address COL_ADDR is generated from the column address decoder 322 and output a column address COL_ADDR_BCONT as a result of the inversion.

When the internal column address COL_ADDR generated from the column address decoder 322 has an even-numbered value, the column address counter 382 generates the 128 even-numbered column addresses COL_ADDR<2, 4, . . . , 256> by counting each of the remaining 7 bits except for the LSB 1 bit of the internal column address COL_ADDR 128 times. The inversion control unit 384 outputs the column address COL_ADDR_BCONT without inverting the LSB 1 bit of the counting address CNT_COL_ADDR generated from the column address counter 382 so that the 128 even-numbered column addresses COL_ADDR<2, 4, . . . , 256> are transferred to the column operation region 60. Thereafter, the column address counter 382 generates the 128 even-numbered column addresses COL_ADDR<2, 4, . . . , 256> by counting each of the remaining 7 bits except for the LSB 1 bit of the internal column address COL_ADDR again 128 times. The inversion control unit 384 inverts the LSB 1 bit of the counting address CNT_COL_ADDR generated from the column address counter 382 and outputs the column address COL_ADDR_BCONT as a result of the inversion so that the 128 odd-numbered column addresses COL_ADDR<1, 3, . . . , 255> may be transferred to the column operation region 60.

Similarly, when the internal column address COL_ADDR generated from the column address decoder 322 has an odd-numbered value, the column address counter 382 generates the 128 odd-numbered column addresses COL_ADDR<1, 3, . . . , 255> by counting each of the remaining 7 bits except for the LSB 1 bit of the internal column address COL_ADDR 128 times. The inversion control unit 384 outputs the column address COL_ADDR_BCONT without inverting the LSB 1 bit of the counting address CNT_COL_ADDR generated from the column address counter 382 so that the 128 odd-numbered column addresses COL_ADDR<1, 3, . . . , 255> may be transferred to the column operation region 60. Thereafter, the column address counter 382 generates the 128 odd-numbered column addresses COL_ADDR<1, 3, . . . , 255> by counting each of the remaining 7 bits except for the LSB 1 bit of the internal column address COL_ADDR 128 times. The inversion control unit 384 inverts the LSB 1 bit of the counting address CNT_COL_ADDR generated from the column address counter 382 and outputs the column address COL_ADDR_BCONT as a result of the inversion so that the 128 even-numbered column addresses COL_ADDR<2, 4, . . . , 256> may be transferred to the column operation region 60.

There are several methods that the inversion control unit 384 determines a point in time at which the 128 counting operations of the column address counter 382 are finished. First, a method of sensing the number of toggled operation clocks (not shown) after the internal column address COL_ADDR is generated from the column address decoder 322 may be utilized since the inversion control unit 384 and the column address counter 382 operate using the same operation clock (not shown). Additionally, a method may be utilized in which the column address counter 382 generates a specific control signal (not shown) when the 128 counting operations are finished and transfers the specific control signal to the inversion control unit 384.

When the column address output unit 380 generates the 128 even-numbered column addresses COL_ADDR<2, 4, . . . , 256> and provides the generated 128 even-numbered column addresses COL_ADDR<2, 4, . . . , 256> to the column operation region 60, the even-numbered array region 310<EVEN> of the memory bank 310 inputs/outputs the 128 data DATA1<1:128> to/from the 128 first local lines LIO1<1:128> in parallel. Similarly, when the column address output unit 380 generates the 128 odd-numbered column addresses COL_ADDR<1, 3, . . . , 255> and provides the generated 128 odd-numbered column addresses to the column operation region 60, the odd-numbered array region 310<ODD> of the memory bank 310 inputs/outputs the 128 data DATA2<1:128> to/from the 128 second local lines LIO2<1:128> in parallel. Accordingly, when the column address output unit 380 first generates and provides the 128 even-numbered column addresses COL_ADDR<2, 4, . . . , 256> to the column operation region 60 and then generates and provides the 128 odd-numbered column addresses COL_ADDR<1, 3, . . . , 255> to the column operation region 60, the even-numbered array region 310<EVEN> of the memory bank 310 inputs/outputs the 128 data DATA1<1:128> to/from the first local lines LIO1<1:128>. Thereafter, the odd-numbered array region 310<ODD> of the memory bank 310 inputs/outputs the 128 data DATA2<1:128> to/from the second local lines LIO2<1:128>. In contrast, when the column address output unit 380 first generates and provides the 128 odd-numbered column addresses COL_ADDR<1, 3, . . . , 255> to the column operation region 60 and then generates and provides the 128 even-numbered column addresses COL_ADDR<2, 4, . . . , 256> to the column operation region 60, the odd-numbered array region 310<ODD> of the memory bank 310 inputs/outputs the 128 data DATA2<1:128> to/from the second local lines LIO2<1:128>. Thereafter, the even-numbered array region 310<EVEN> of the memory bank 310 inputs/outputs the 128 data DATA1<1:128> to/from the first local lines LIO1<1:128>.

The strobe signal generation unit 370 and the column command decoder 342 control whether or not to toggle a strobe signal COL_STRB for defining a section of the column operation region 360 in which a data I/O operation is performed in the memory bank 310 in response to the external command CMD. When the external command CMD is related to a column operation, the column command decoder 342 generates an internal column command COL_CMD by decoding the external command CMD. Furthermore, the strobe signal generation unit 370 consecutively toggles the strobe signal COL_STRB twice in response to one internal column command COL_CMD generated from the column command decoder 342. The strobe signal COL_STRB is controlled such that it is first toggled at a point in time corresponding to a section in which the column address generation unit (322, 380) first generates the 128 odd-numbered column addresses COL_ADDR<1, 3, . . . , 255> or the 128 even-numbered column addresses COL_ADDR<2, 4, . . . , 256> and it is second toggled at a point in time corresponding to a section in which the column address generation unit (322, 380) secondly generates the 128 even-numbered column addresses COL_ADDR<2, 4, . . . , 256> or the 128 odd-numbered column addresses COL_ADDR<1, 3, . . . , 255>. That is, when the column address generation unit (322, 380) consecutively generates the 128 odd-numbered or even-numbered column addresses COL_ADDR<1, 3, . . . , 255> or COL_ADDR<2, 4, . . . , 256> and the 128 even-numbered or odd-numbered column addresses COL_ADDR<2, 4, . . . , 256> or COL_ADDR<1, 3, . . . , 255>, the strobe signal generation unit 370 also consecutively toggles the strobe signal COL_STRB twice so that the data of the memory bank 310 may be normally inputted/outputted in the column operation region 60.

The operation of the strobe signal generation unit 370 may be associated with the operation of and the column address generation unit (322, 380) since the strobe signal generation unit 370 and the column address generation unit (322, 380) use the same operation clock (not shown). That is, the operations of the strobe signal generation unit 370 and the column address generation unit (322, 380) are controlled so that they are associated with each other on the basis of a point in time at which the operation clock (not shown) is properly toggled.

Through the aforementioned operation of the column address generation unit (322, 380) and the strobe signal generation unit 370, the data I/O sections of the odd-numbered array region 310<ODD> and the even-numbered array region 310<EVEN> do not overlap with each other, and the odd-numbered array region 310<ODD> and the even-numbered array region 310<EVEN> always consecutively operate in association with each other. For example, when the internal column address COL_ADDR has an even-numbered value, the even-numbered array region 310<EVEN> first performs an operation of inputting or outputting the 128 data DATA1<1:128> in parallel through the 128 first local lines LIO1<1:128>, and the odd-numbered array region 310<ODD> then performs an operation of inputting or outputting the 128 data DATA2<1:128> in parallel through the 128 second local lines LIO2<1:128>. In contrast, when the internal column address COL_ADDR has an odd-numbered value, the odd-numbered array region 310<ODD> first performs an operation of inputting or outputting the 128 data DATA2<1:128> in parallel through the second local lines LIO2<1:128>, and the even-numbered array region 310<EVEN> then performs an operation of inputting or outputting the 128 data DATA1<1:128> in parallel through the 128 first local lines LIO1<1:128>. Since a section in which the 128 data DATA1<1:128> are loaded onto the 128 first local lines LIO1<1:128> does not overlap with a section in which the 128 data DATA2<1:128> are loaded onto the 128 second local lines LIO2<1:128>, normal data I/O operations may be performed when the 128 data DATA1<1:128> do not collide against the 128 data DATA2<1:128> although the 128 first local lines LIO1<1:128> and the 128 second local lines LIO2<1:128> are directly coupled to the 128 global lines GIO<1:128> without additional selection means.

The data output unit 334 serializes the 128 data DATA1<1:128> or DATA2<1:128>, loaded onto the 128 global lines GIO<1:128>, by 8 bits, respectively, and outputs the serialized data to the 16 16-bit data I/O pads DQ<1:16>. The bit number of serialized data outputted to each of the 16 data I/O pads DQ<1:16> is 16 since the 128 data DATA1<1:128> or DATA2<1:128> are always consecutively loaded onto the 128 global lines GIO<1:128> twice.

The data input unit 332 parallelizes 256 data, applied thereto in series by 16 bits through the 16 data I/O pads DQ<1:16>, by 128 data and consecutively loads the parallelized 256 data onto the 128 global lines GIO<1:128> twice. That is, the data input unit 332 parallelizes 256 data applied thereto in series by 16 bits through the 16 data I/O pads DQ<1:16> by separating the 256 data by 8 bits and consecutively loads the parallelized 256 data onto the 128 global lines GIO<1:128> twice.

As described above, the data input unit 332 and the data output unit 334 actually input and output the 256 data, but separate the 256 data by 128 data, and input and output the 256 data. A criterion for the separation operation may be the toggling of the strobe signal COL_STRB. That is, the data input unit 332 and the data output unit 334 may input and output the first 128 data of the 256 data in response to the first toggling of the strobe signal COL_STRB and may input and output the second 128 data of the 256 data in response to the second toggling of the strobe signal COL_STRB.

When the internal column command COL_CMD is determined to be a read command (not shown) and the strobe signal COL_STRB is first toggled and the 128 data DATA1<1:128> or DATA2<1:128> are outputted from the even-numbered array region 310<EVEN> or the odd-numbered array region 310<ODD> of the memory bank 310, the data output unit 334 serializes the 128 data DATA1<1:128> or DATA2<1:128>, received from the 128 global lines GIO<1:128> in parallel, by 8 bits, respectively, and outputs the serialized data through the 16 data I/O pads DQ<1:16>. In response to the second toggling of the strobe signal COL_STRB, when the 128 data DATA2<1:128> or DATA1<1:128> are outputted from the odd-numbered array region 310<ODD> or the even-numbered array region 310<EVEN> of the memory bank 310, the data output unit 334 serializes the 128 data DATA2<1:128> or DATA1<1:128>, received from the 128 global lines GIO<1:128> in parallel, by 8 bits, respectively, and outputs the serialized data through the 16 data I/O pads DQ<1:16>.

Similarly, when the internal column command COL_CMD is determined to be a write command (not shown) and the strobe signal COL_STRB is first toggled, the data input unit 332 loads the first 128 data of the 256 data, which are first received through the 16 data I/O pads DQ<1:16> and serialized by 8 bits, onto the 128 global lines GIO<1:128> in parallel so that the 128 data DATA1<1:128> or DATA2<1:128> may be stored in the even-numbered array region 310<EVEN> or the odd-numbered array region 310<ODD> of the memory bank 310. In response to the second toggling of the strobe signal COL_STRB, the data input unit 332 loads the second 128 data the 256 data, which are secondly received through the 16 data I/O pads DQ<1:16> and serialized by 8 bits, onto the 128 global lines GIO<1:128> in parallel so that the 128 data DATA2<1:128> or DATA1<1:128> may be stored in the odd-numbered array region 310<ODD> or the even-numbered array region 310<EVEN> of the memory bank 310.

For reference, each of the data input unit 332 and the data output unit 334 may include temporary data memory means, such as a pipe latch, although not shown, so that a data serial-to-parallel conversion operation or a data parallel-to-serial conversion operation may be smoothly performed.

Figure 4:
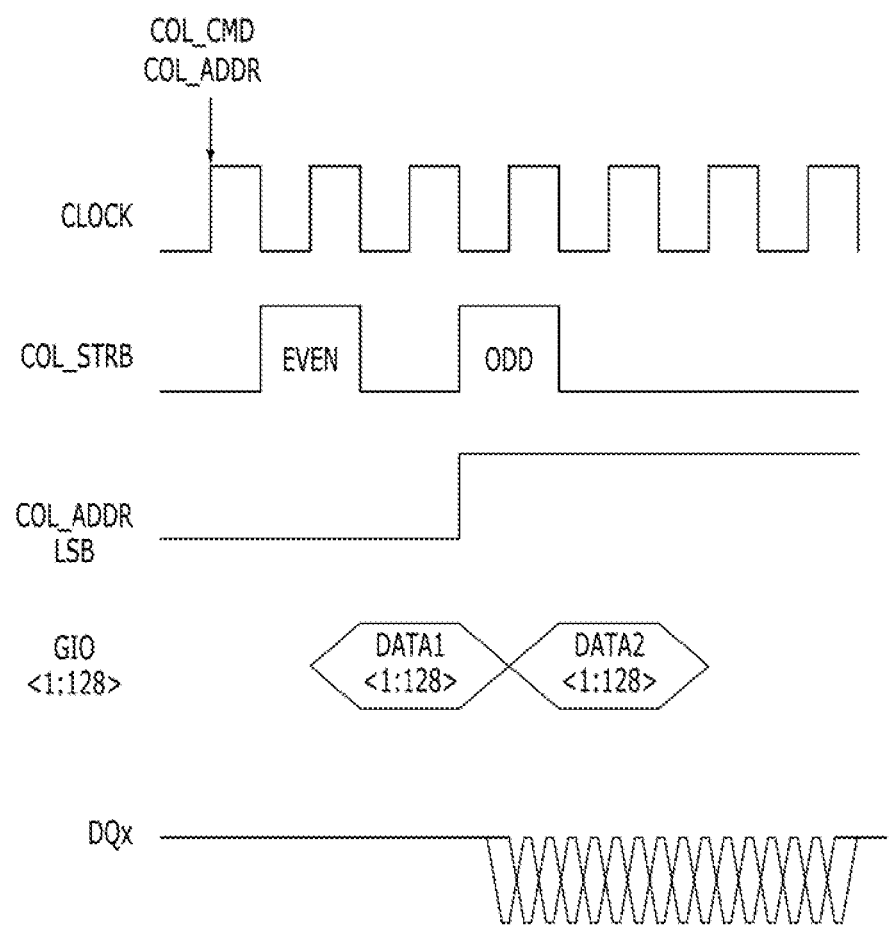
FIG. 4 is a timing diagram illustrating an operation of the semiconductor memory device of FIG. 3.

FIG. 4 is a timing diagram illustrating an operation of the semiconductor memory device of FIG. 3.

Referring to FIG. 4, the operation of the semiconductor memory device to which the 16-bit pre-fetch scheme has been applied in accordance with the exemplary embodiment of the present invention, may be repeatedly applied to a case where the external command CMD is decoded as a command related to a column operation and thus the internal column command COL_CMD is generated.

In synchronization with an operation clock CLOCK, the internal column command COL_CMD for reading data is applied in addition to the internal column address COL_ADDR having an even-numbered value. The strobe signal COL_STRB is consecutively toggled twice in response to the internal column command COL_CMD. Furthermore, a value of the LSB 1 bit of the column address COL_ADDR is changed from "0" to "1" in response to the second toggling of two consecutive togglings of the strobe signal COL_STRB after the first toggling of the strobe signal COL_STRB is finished. Data loaded onto the global lines GIO<1:128> switch from the data DATA1<1:128> of the first local lines LIO1<1:128> to the data DATA2<1:128> of the second local lines LIO2<1:128> in response to the second toggling of the strobe signal COL_STRB. Accordingly, serialized 16 16-bit data are outputted through the respective DQxs of the 16 data I/O pads DQ<1:16>.

When the internal column command COL_CMD for reading data is received along with the column address COL_ADDR having an even-numbered value, 128 even-numbered column addresses COL_ADDR<2, 4, . . . , 256> are generated by a counting operation on the column address COL_ADDR having an even-numbered value. The LSB 1 bit of the column address COL_ADDR is fixed to an even-numbered value of "0". Then, 128 data DATA1<1:128> are read from the even-numbered array region 310<EVEN> in response to the first toggling of the strobe signal COL_STRB and loaded onto the 128 first local lines LIO1<1:128> in parallel. The 128 data DATA1<1:128> read from the even-numbered array region 310<EVEN> may be directly loaded onto the 128 global lines GIO<1:128> since the 128 first local lines LIO1<1:128> and the 128 global lines GIO<1:128> are directly coupled. The 128 data DATA1<1:128> loaded onto the 128 global lines GIO<1:128> are serialized by the data output unit 334 by 8 bits and then outputted through the 16 data I/O pads DQ<1:16>.

After all the even-numbered column addresses COL_ADDR<2, 4, . . . , 256> are generated, 128 odd-numbered column addresses COL_ADDR<1, 3, . . . , 255> are generated by a counting operation. The LSB 1 bit of the column address COL_ADDR is fixed to an odd-numbered value of "1". Then, 128 data DATA2<1:128> are read from the odd-numbered array region 310<ODD> in response to the first toggling of the strobe signal COL_STRB and loaded onto the 128 second local lines LIO2<1:128> in parallel. The 128 data DATA2<1:128> read from the odd-numbered array region 310<ODD> may be directly loaded onto the 128 global lines GIO<1:128> since the 128 second local lines LIO2<1:128> and the 128 global lines GIO<1:128> are directly coupled. The 128 data DATA2<1:128> loaded onto the 128 global lines GIO<1:128> are serialized by the data output unit 334 by 8 bits and then outputted through the 16 data I/O pads DQ<1:16>.

In accordance with the exemplary embodiment of the present invention as described above, the memory bank 310 of the semiconductor memory device is classified into the odd-numbered array region 310<ODD> and the even-numbered array region 310<EVEN> on the basis of the column address COL_ADDR, and the odd-numbered array region 310<ODD> and the even-numbered array region 310<EVEN> consecutively input/output data in predetermined order every column operation. Accordingly, a 16-bit pre-fetch operation may be supported while minimizing an increase in the area of data transmission lines. For example, a 16-bit pre-fetch operation may be supported, and data I/O operations may also be performed between the memory bank 310 and the 16 data I/O pads DQ<1:16> through the 128 global lines GIO<1:128>.

Furthermore, the time taken to sense and amplify data inputted/outputted between the memory bank 310 and the first local lines LIO1<1:128> and between the memory bank 310 and the second local lines LIO2<1:128> may be sufficiently guaranteed since the first local lines LIO1<1:128> corresponding to the even-numbered array region 310<EVEN> and the second local lines LIO2<1:128> corresponding to the odd-numbered array region 310<ODD> alternately operate.

Particularly, a semiconductor memory device supporting a 16-bit pre-fetch operation has been described as an example in connection with the exemplary embodiment, but the present invention may be applied to a semiconductor memory device which supports a 16-bit-lower or -higher pre-fetch operation.

Figure 5:
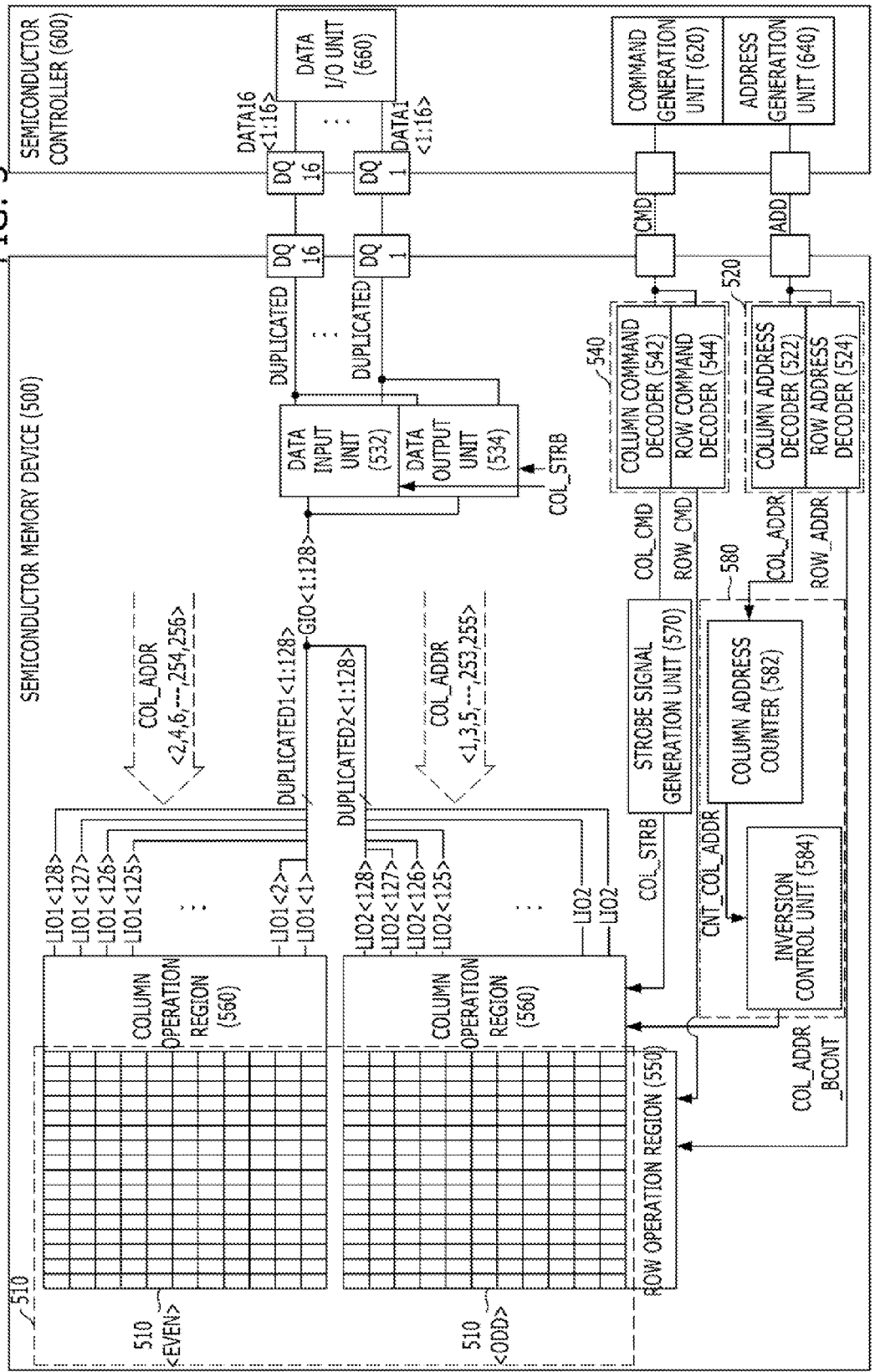
FIG. 5 is a block diagram illustrating a semiconductor system to which a 16-bit pre-fetch scheme has been applied in accordance with an exemplary embodiment of the present invention.

FIG. 5 is a block diagram illustrating a semiconductor system to which a 16-bit pre-fetch scheme has been applied in accordance with an exemplary embodiment of the present invention.

Referring to FIG. 5, the semiconductor system to which the 16-bit pre-fetch scheme has been applied in accordance with the exemplary embodiment of the present invention includes a semiconductor memory device 500 and a semiconductor controller 600.

The semiconductor memory device 500 includes a memory bank 510, an address decoder 520, a data input unit 532, a data output unit 534, a command decoder 540, 16 data I/O pads DQ<1:16>, a column operation region 560, a row operation region 550, a strobe signal generation unit 570, and a column address output unit 580. The memory bank 510 includes an odd-numbered array region 510<ODD> and an even-numbered array region 510<EVEN>. The semiconductor memory device 500 further includes 128 first local lines LIO1<1:128>, 128 second local lines LIO2<1:128> and 128 global lines GIO<1:128>. Additionally, the command decoder 540 includes a column command decoder 542 and a row command decoder 544. The address decoder 520 includes a column address decoder 522 and a row address decoder 524. The column address output unit 580 includes a column address counter 582 and an inversion control unit 584. Both the column address decoder 522 and the column address output unit 580 are for processing a column address and may be denoted as a column address generation unit (522, 580). Furthermore, in the semiconductor memory device 500 of FIG. 5, the row operation region 550 performs an operation of a selecting a word line of the memory bank 510 in response to a row command ROW_CMD generated from the row command decoder 540 and a row address ROW_ADDR generated from the row address decoder 520. The semiconductor controller 600 includes a command generation unit 620, an address generation unit 640, and a data I/O unit 660.

The semiconductor controller 600 controls an operation of the semiconductor memory device 500 to generate an external command CMD and an external address ADD and transfer the external command CMD and the external address ADD to the semiconductor memory device 500.

The semiconductor memory device 500 inputs/outputs 16 data DATA1<1:16>, DATA2<1:16>, DATA3<1:16>, . . . , DATA15<1:16>, and DATA16<1:16>, serialized by 16 data pads, when a column command COL_CMD related to a column operation, of the external command CMD, and a column address COL_ADDR related to a column operation, of the external address ADD are received.

The semiconductor memory device 500 of FIG. 5 in accordance with the exemplary embodiment of the present invention has the same construction and operation of the semiconductor memory device of FIG. 3 in accordance with the exemplary embodiment of the present invention. Accordingly, for a detailed construction and operation of the semiconductor memory device 500 of FIG. 5 in accordance with the exemplary embodiment of the present invention, reference may be made to the semiconductor memory device in accordance with the exemplary embodiment of the present invention of FIG. 3.

An operation of the semiconductor controller 600 of FIG. 5 in accordance with the exemplary embodiment of the present invention is defined as in FIGS. 6A and 6B depending on a relationship between two or more column addresses COL_ADDR consecutively transmitted to the semiconductor memory device 500.

FIGS. 6A and 6B are timing diagrams illustrating operations of the semiconductor memory device of FIG. 5.

FIG. 6A illustrates a method for controlling the operation of the semiconductor memory device 500 by the semiconductor controller 600 when two or more column addresses COL_ADDR consecutively transmitted from the semiconductor controller 600 to the semiconductor memory device 500 have the same value in the semiconductor system to which a 16-bit pre-fetch scheme has been applied in accordance with the exemplary embodiment of the present invention.

When all of two or more column addresses COL_ADDR consecutively transmitted from the semiconductor controller 600 to the semiconductor memory device 500 have even-numbered values or odd-numbered values, two column addresses COL_ADDR are controlled to have a minimum interval, that is, an interval of 4*(CAS to CAS delay) (4*tCCD). Accordingly, at a point in time at which 4 clocks (4*tCK) of an operation clock CLOCK elapse after the first column command COL_CMD, together with the column address COL_ADDR having an even-numbered value hereinafter, referred to as an "even-numbered column address COL_ADDR<EVEN>", is applied from the semiconductor controller 600 to the semiconductor memory device 500, a second column command COL_CMD, together with an even-numbered column address COL_ADDR<EVEN>, is applied from the semiconductor controller 600 to the semiconductor memory device 500. Similarly, at a point in time at which 4 clocks (4*tCK) of the operation clock CLOCK elapse after the first column command COL_CMD, together with the column address COL_ADDR having an odd-numbered value hereinafter, referred to as an "odd-numbered column address COL_ADDR<ODD>", is applied from the semiconductor controller 600 to the semiconductor memory device 500, the second column command COL_CMD, together with an odd-numbered column address COL_ADDR<ODD>, may be applied from the semiconductor controller 600 to the semiconductor memory device 500.

The interval of 4*tCCD between two column addresses COL_ADDR consecutively applied has been defined as a minimum interval, due to a 16-bit pre-fetch scheme having been applied to the semiconductor memory device. That is, since recent semiconductor memory devices operate at high speed, 4 data are chiefly inputted/outputted i.e., a quarter date rate (QDR), in one cycle (1*tCK) of the operation clock CLOCK. For 16 data to be inputted/outputted in series by applying such a criterion to the 16-bit pre-fetch scheme, the operation clock CLOCK may be set to include at least four cycles (4*tCK) between two column addresses COL_ADDR. Accordingly, when an 8-bit pre-fetch scheme is applied to a semiconductor memory device, a minimum interval between two column addresses COL_ADDR may be 2*tCCD.

The strobe signal COL_STRB is consecutively toggled twice in response to one column command COL_CMD within the semiconductor memory device 500. Accordingly, the strobe signal COL_STRB is consecutively toggled twice in response to the first column command COL_CMD, and the strobe signal COL_STRB is consecutively toggled twice in response to the second column command COL_CMD. The first toggling of the strobe signal COL_STRB is an operation for outputting data from the even-numbered array region 510<EVEN> and the second toggling of the strobe signal COL_STRB is an operation for outputting data from the odd-numbered array region 510<ODD> since the column addresses COL_ADDR received along with the respective first and the second column commands COL_CMD have even-numbered values.

The LSB 1 bit of the column address COL_ADDR is changed from "0" to "1" in response to the second toggling of the strobe signal COL_STRB that is consecutively toggled twice whenever the column command COL_CMD is received, after the first toggling of the strobe signal COL_STROB is finished. Thereafter, the LSB 1 bit of the column address COL_ADDR is changed from "1" to "0" in response to the first toggling of the strobe signal COL_STROB after the second toggling of the strobe signal COL_STROB is finished.

Data loaded onto the global lines GIO<1:128> switch from the data DATA1<1:128> of the first local lines LIO1<1:128> to the data DATA2<1:128> of the second local lines LIO2<1:128> in response to the second toggling of the strobe signal COL_STRB that is consecutively toggled twice when the column command COL_CMD is received, after the first toggling of the strobe signal COL_STROB is finished. Similarly, data loaded onto the global lines GIO<1:128> switch from the data DATA2<1:128> of the second local lines LIO2<1:128> to the data DATA1<1:128> of the first local lines LIO1<1:128> in response to the first toggling of two consecutive toggling of the strobe signal COL_STROB after the second toggling of the strobe signal COL_STROB is finished. Thereafter, data loaded onto the global lines GIO<1:128> switch from the data DATA1<1:128> of the first local lines LIO1<1:128> to the data DATA2<1:128> of the second local lines LIO2<1:128> in response to the second toggling of two consecutive toggling of the strobe signal COL_STROB after the first toggling of the strobe signal COL_STROB is finished. Accordingly, 16 data serialized through the respective DQxs of the 16 data I/O pads DQ<1:16> are consecutively outputted twice with almost no interval. That is, 32 serialized data are outputted through the respective DQxs of the 16 data I/O pads DQ<1:16> in response to two column commands COL_CMD that are consecutively received.

When the first column command COL_CMD for reading data is received along with the column address COL_ADDR having an even-numbered value, 128 even-numbered column addresses COL_ADDR<2, 4, . . . , 256> are generated by a counting operation on the column address COL_ADDR having an even-numbered value. The LSB 1 bit of the column address COL_ADDR is fixed to an even-numbered value of "0". Then, 128 data DATA1<1:128> are read from the even-numbered array region 510<EVEN> in response to the first toggling of the strobe signal COL_STRB and loaded onto the 128 first local lines LIO1<1:128> in parallel. The 128 data DATA1<1:128> read from the even-numbered array region 510<EVEN> may be directly loaded onto the 128 global lines GIO<1:128> because the 128 first local lines LIO1<1:128> and the 128 global lines GIO<1:128> are directly coupled.

The 128 data DATA1<1:128> loaded onto the 128 global lines GIO<1:128> are serialized by the data output unit 534 by 8 bits and then outputted through the 16 data I/O pads DQ<1:16>.

After all of the even-numbered column addresses COL_ADDR<2, 4, . . . , 256> corresponding to the first column command COL_CMD are generated, 128 odd-numbered column addresses COL_ADDR<1, 5, . . . , 255> are generated by a counting operation. The LSB 1 bit of the column address COL_ADDR is fixed to an odd-numbered value of "1". Then, 128 data DATA2<1:128> are read from the odd-numbered array region 510<ODD> in response to the second toggling of the strobe signal COL_STRB and loaded onto the 128 second local lines LIO2<1:128> in parallel. The 128 data DATA2<1:128> read from the odd-numbered array region 510<ODD> may be directly loaded onto the 128 global lines GIO<1:128> since the 128 second local lines LIO2<1:128> and the 128 global lines GIO<1:128> are directly coupled. The 128 data DATA2<1:128> loaded onto the 128 global lines GIO<1:128> are serialized by the data output unit 534 by 8 bits and then outputted through the 16 data I/O pads DQ<1:16>.

When the second column command COL_CMD for reading data is received along with the column address COL_ADDR having an even-numbered value at a point in time at which all the odd-numbered column addresses COL_ADDR<1, 3, . . . , 255> corresponding to the first column command COL_CMD are generated, the 128 even-numbered column addresses COL_ADDR<2, 4, . . . , 256> are generated by a counting operation on the column address COL_ADDR having an even-numbered value. The LSB 1 bit of the column address COL_ADDR is fixed to an even-numbered value of "0". Then, 128 data DATA1<1:128> are read from the even-numbered array region 510<EVEN> in response to the first toggling of the strobe signal COL_STROB and loaded onto the 128 first local lines LIO1<1:128> in parallel. The 128 data DATA1<1:128> read from the even-numbered array region 510<EVEN> may be directly loaded onto the 128 global lines GIO<1:128> because the 128 first local lines LIO1<1:128> and the 128 global lines GIO<1:128> are directly coupled. The 128 data DATA1<1:128> loaded onto the 128 global lines GIO<1:128> are serialized by the data output unit 534 by 8 bits and then outputted through the 16 data I/O pads DQ<1:16>.

After all of the even-numbered column addresses COL_ADDR<2, 4, . . . , 256> are generated in response to the second column command COL_CMD, 128 odd-numbered column addresses COL_ADDR<1, 5, . . . , 255> are generated by a counting operation. The LSB 1 bit of the column address COL_ADDR is fixed to an odd-numbered value of "1". Then, 128 data DATA2<1:128> are read from the odd-numbered array region 510<ODD> in response to the second toggling of the strobe signal COL_STROB and loaded onto the 128 second local lines LIO2<1:128> in parallel. The 128 data DATA2<1:128> read from the odd-numbered array region 510<ODD> may be directly loaded onto the 128 global lines GIO<1:128> since the 128 second local lines LIO2<1:128> and the 128 global lines GIO<1:128> are directly coupled. The 128 data DATA2<1:128> loaded onto the 128 global lines GIO<1:128> are serialized by the data output unit 534 by 8 bits and then outputted through the 16 data I/O pads DQ<1:16>.

FIG. 6B shows a method for controlling the operation of the semiconductor memory device 500 by the semiconductor controller 600 when two or more column addresses COL_ADDR consecutively transmitted from the semiconductor controller 600 to the semiconductor memory device 500 have different values in the semiconductor system to which the 16-bit pre-fetch scheme has been applied in accordance with the exemplary embodiment of the present invention.

When one of two or more column addresses COL_ADDR consecutively transmitted from the semiconductor controller 600 to the semiconductor memory device 500 has an even-numbered value and the other of the two or more column addresses COL_ADDR has an odd-numbered value, or one of the two or more column addresses COL_ADDR has an odd-numbered value and the other of the two or more column addresses COL_ADDR has an even-numbered value, the two or more column addresses COL_ADDR are controlled to have an interval that is longer than a minimum interval by a set interval, that is, an interval longer than 4*tCCD that is a minimum interval, by a set interval that is one cycle (1*tCK) of the operation clock CLOCK. Accordingly, at a point in time at which 5 clocks (5*tCK) of the operation clock CLOCK elapse after the first column command COL_CMD, together with an even-numbered column address COL_ADDR<EVEN>, is applied from the semiconductor controller 600 to the semiconductor memory device 500, the second column command COL_CMD, together with an odd-numbered column address COL_ADDR<ODD>, is applied from the semiconductor controller 600 to the semiconductor memory device 500. Similarly, at a point in time at which 5 clocks (5*tCK) of the operation clock CLOCK elapse after the first column command COL_CMD, together with the odd-numbered column address COL_ADDR<ODD>, is applied from the semiconductor controller 600 to the semiconductor memory device 500, the second column command COL_CMD, together with an even-numbered column address COL_ADDR<EVEN>, may be applied from the semiconductor controller 600 to the semiconductor memory device 500.

When two or more column addresses COL_ADDR consecutively transmitted from the semiconductor controller 600 to the semiconductor memory device 500 as described above have different values, the two or more column addresses COL_ADDR have a delay interval longer than a minimum delay interval, due to the semiconductor memory device proposed by the present invention internally separating and performing data I/O operations depending on whether the externally received column address COL_ADDR has an odd-numbered value or an even-numbered value. For example, when the externally received column address COL_ADDR has an even-numbered value, the semiconductor memory device proposed by the present invention performs data I/O operations in response to the column address COL_ADDR having the even-numbered value and then performs data I/O operations in response to the column address COL_ADDR having an odd-numbered value. However, if the column address COL_ADDR having an odd-numbered value is received after the column address COL_ADDR having an even-numbered value, the semiconductor memory device proposed by the present invention internally performs data I/O operations in response to the column address COL_ADDR having the odd-numbered value and then immediately performs data I/O operations in response to the column address COL_ADDR having the odd-numbered value. When data I/O operations are consecutively performed in response to the column address COL_ADDR having an odd-numbered value, an absolute time necessary to sense and amplify inputted/outputted data is very short. Accordingly, when there is a possibility that operations for inputting/outputting data may be consecutively generated in response to the column address COL_ADDR having an odd-numbered value as in FIG. 6B, there is an operation in which a set interval may be added between the data I/O operations that are consecutively performed.

When the column commands COL_CMD are applied, the strobe signal COL_STRB is consecutively toggled twice within the semiconductor memory device 500. Accordingly, the strobe signal COL_STRB is consecutively toggled twice in response to the first column command COL_CMD, and the strobe signal COL_STRB is consecutively toggled twice in response to the second column command COL_CMD. The first toggling of the first strobe signal COL_STRB is an operation for outputting data from the even-numbered array region 510<EVEN> and the second toggling of the first strobe signal COL_STRB is an operation for outputting data from the odd-numbered array region 510<ODD> since the column address COL_ADDR received along with the first column command COL_CMD has an even-numbered value. In contrast, since the column address COL_ADDR received along with the second column command COL_CMD has an odd-numbered value, the first toggling of the second strobe signal COL_STRB is an operation for outputting data from the odd-numbered array region 510<ODD>, and the second toggling of the second strobe signal COL_STRB is an operation for outputting data from the even-numbered array region 510<EVEN>.

The LSB 1 bit of the column address COL_ADDR is changed from "0" to "1" in response to the second toggling of the first strobe signal COL_STRB after the first toggling of the first strobe signal COL_STRB is finished. Thereafter, the LSB 1 bit of the column address COL_ADDR is changed from "1" to "0" in response to the second toggling of the second strobe signal COL_STRB after the first toggling of the second strobe signal COL_STRB is finished.

Data loaded onto the global lines GIO<1:128> switch from the data DATA1<1:128> of the first local lines LIO1<1:128> to the data DATA2<1:128> of the second local lines LIO2<1:128> in response to the second toggling of the first strobe signal COL_STRB after the first toggling of the first strobe signal COL_STRB is finished. Similarly, data loaded onto the global lines GIO<1:128> switch from the data DATA2<1:128> of the second local lines LIO2<1:128> to the data DATA1<1:128> of the first local lines LIO1<1:128> in response to the second toggling of the second strobe signal COL_STRB after the first toggling of the second strobe signal COL_STRB is finished. Accordingly, 16 data serialized through the respective DQxs of the 16 data I/O pads DQ<1:16> are consecutively outputted twice at set intervals. That is, 32 data serialized through the respective DQxs of the 16 data I/O pads DQ<1:16> are outputted in response to two column commands COL_CMD that are consecutively received at a set interval.

When the first column command COL_CMD for reading data is received along with the column address COL_ADDR having an even-numbered value, 128 even-numbered column addresses COL_ADDR<2, 4, . . . , 256> are generated by a counting operation on the column address COL_ADDR having the even-numbered value. The LSB 1 bit of the column address COL_ADDR is fixed to an even-numbered value of "0". Then, 128 data DATA1<1:128> are read from the even-numbered array region 510<EVEN> in response to the first toggling of the first strobe signal COL_STRB and loaded onto the 128 first local lines LIO1<1:128> in parallel. The 128 data DATA1<1:128> read from the even-numbered array region 510<EVEN> may be directly loaded onto the 128 global lines GIO<1:128> since the 128 first local lines LIO1<1:128> and the 128 global lines GIO<1:128> are directly coupled. The 128 data DATA1<1:128> loaded onto the 128 global lines GIO<1:128> are serialized by the data output unit 534 by 8 bits and then outputted through the 16 data I/O pads DQ<1:16>.

After all of the even-numbered column addresses COL_ADDR<2, 4, . . . , 256> corresponding to the first column command COL_CMD are generated, 128 odd-numbered column addresses COL_ADDR<1, 5, . . . , 255> are generated by a counting operation. The LSB 1 bit of the column address COL_ADDR is fixed to an odd-numbered value of "1". Then, 128 data DATA2<1:128> are read from the odd-numbered array region 510<ODD> in response to the second toggling of the first strobe signal COL_STRB and loaded onto the 128 second local lines LIO2<1:128> in parallel. The 128 data DATA2<1:128> read from the odd-numbered array region 510<ODD> may be directly loaded onto the 128 global lines GIO<1:128> since the 128 second local lines LIO2<1:128> and the 128 global lines GIO<1:128> are directly coupled. The 128 data DATA2<1:128> loaded onto the 128 global lines GIO<1:128> are serialized by the data output unit 534 by 8 bits and then outputted through the 16 data I/O pads DQ<1:16>.

After a point in time at which all of the odd-numbered column addresses COL_ADDR<1, 3, . . . , 255> corresponding to the first column command COL_CMD are generated, when the second column command COL_CMD for reading data is received along with the column address COL_ADDR having an odd-numbered value with one cycle (1*tCK) of the operation clock CLOCK, that is, a set interval, interposed between the point in time and the second column command COL_CMD, 128 odd-numbered column addresses COL_ADDR<1, 3, . . . , 255> are generated by a counting operation on the column address COL_ADDR having an odd-numbered value. The LSB 1 bit of the column address COL_ADDR is fixed to an odd-numbered value of "1". Then, 128 data DATA2<1:128> are read from the odd-numbered array region 510<ODD> in response to the first toggling of the second strobe signal COL_STROB and loaded onto the 128 second local lines LIO2<1:128> in parallel. The 128 data DATA2<1:128> read from the odd-numbered array region 510<ODD> may be directly loaded onto the 128 global lines GIO<1:128> since the 128 second local lines LIO2<1:128> and the 128 global lines GIO<1:128> are directly coupled. The 128 data DATA2<1:128> loaded onto the 128 global lines GIO<1:128> are serialized by the data output unit 534 by 8 bits and then outputted through the 16 data I/O pads DQ<1:16>.

After all of the odd-numbered column addresses COL_ADDR<1, 3, . . . , 255> are generated in response to the second column command COL_CMD, 128 even-numbered column addresses COL_ADDR<2, 4, . . . , 256> are generated by a counting operation. The LSB 1 bit of the column address COL_ADDR is fixed to an even-numbered value of "O". Then, 128 data DATA1<1:128> are read from the even-numbered array region 510<EVEN> in response to the second toggling of the second strobe signal COL_STROB and loaded onto the 128 first local lines LIO1<1:128> in parallel. The 128 data DATA1<1:128> read from the even-numbered array region 510<EVEN> may be directly loaded onto the 128 global lines GIO<1:128> since the 128 first local lines LIO1<1:128> and the 128 global lines GIO<1:128> are directly coupled. The 128 data DATA1<1:128> loaded onto the 128 global lines GIO<1:128> are serialized by the data output unit 534 by 8 bits and then outputted through the 16 data I/O pads DQ<1:16>.

In accordance with the exemplary embodiment of the present invention as described above, the memory bank 510 of the semiconductor memory device is divided into the odd-numbered array region 510<ODD> and the even-numbered array region 510<EVEN> on the basis of the column address COL_ADDR, and the odd-numbered array region 510<ODD> and the even-numbered array region 510<EVEN> consecutively input/output data in predetermined order in each column operation. Accordingly, a 16-bit pre-fetch operation may be supported while minimizing an increase in the area of data transmission lines. For example, a 16-bit pre-fetch operation may be supported, and data I/O operations may be performed through the 128 global lines GIO<1:128> between the memory bank 510 and the 16 data I/O pads DQ<1:16>.

Furthermore, the time taken to sense and amplify data Inputted/outputted between the memory bank 510 and the first local lines LIO1<1:128> and between the memory bank 510 and the second local lines LIO2<1:128> may be sufficiently guaranteed since the first local lines LIO1<1:128> corresponding to the even-numbered array region 510<EVEN> and the second local lines LIO2<1:128> corresponding to the odd-numbered array region 510<ODD> alternately operate.

Particularly, a semiconductor memory device supporting a 16-bit pre-fetch operation has been described as an example in connection with the exemplary embodiment, but the present invention may be applied to a semiconductor memory device which supports a 16-bit-lower or -higher pre-fetch operation.

Furthermore, in the exemplary embodiment, a time interval between two or more column addresses COL_ADDR consecutively transmitted from the semiconductor controller 600 to the semiconductor memory device 500 is properly controlled depending on a value of the two or more column addresses COL_ADDR. Accordingly, the time taken to sense and amplify data within the semiconductor memory device 500 may be sufficiently guaranteed in any circumstance.

As described above, in accordance with the present invention, the memory bank of a semiconductor memory device is divided into an odd-numbered array region and an even-numbered array region on the basis of a column address, and the odd-numbered array region and the even-numbered array region consecutively input/output data in predetermined order in each column operation. Accordingly, there are advantages in that a pre-fetch operation may be supported while minimizing an increase in the area of data transmission lines.

Furthermore, there is an advantage in that the time taken to sense and amplify data within a semiconductor memory device may be sufficiently guaranteed since data transmission lines corresponding to an odd-numbered region and data transmission lines corresponding to an even-numbered region alternately operate.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a memory bank having an odd-numbered array region suitable for inputting/outputting data through N first local lines in response to an odd-numbered column address, and an even-numbered array region suitable for inputting/outputting data through N second local lines in response to an even-numbered column address, N being a positive integer;
a column address generation unit suitable for consecutively generating the odd-numbered column address and the even-numbered column address in response to whether an external column address has an even-numbered value or an odd-numbered value; and
N global lines coupled in common to the N first local lines and the N second local lines, suitable for inputting/outputting data,
wherein the column address generation unit includes:
a column address decoding unit suitable for generating an internal column address by decoding the external column address; and
a column address output unit suitable for outputting the internal column address as the even-numbered or odd-numbered column address, inverting a least significant bit (LSB) of the internal column address, and outputting the inverted column address as the odd-numbered column address or the even-numbered column address.

2. The semiconductor memory device of claim 1, further comprising:
a strobe signal generation unit suitable for controlling whether or not to toggle a strobe signal for defining data input/output (I/O) operations of the memory bank in response to an external column command, wherein the strobe signal generation unit consecutively toggles the strobe signal twice at each point in time at which the column address generation unit generates each of the odd-numbered and the even-numbered column addresses.

3. The semiconductor memory device of claim 2, further comprising:
a data output unit suitable for serializing N data received in parallel from the N global lines and outputting the serialized N data through a data pad in response to the strobe signal; and
a data input unit suitable for parallelizing N data received in series through the data pad and loading the parallelized N data onto the N global lines in response to the strobe signal.

4. The semiconductor memory device of claim 3, wherein the data output unit is suitable for:
after a read command of the external column command is received,
serializing N data, received in parallel from the N global lines, in response to a first toggling of the strobe signal and outputting the serialized N data through the data pad, and
serializing N data, received in parallel from the N global lines, in response to a second toggling of the strobe signal, and outputting the serialized N data through the data pad.

5. The semiconductor memory device of claim 3, wherein the data input unit is suitable for:
after a write command of the external column command is received,
parallelizing N data, received in series through the data pad, in response to a first toggling of the strobe signal and loading the parallelized N data onto the N global lines, and
parallelizing N data, received in series through the data pad, in response to a second toggling of the strobe signal and loading the parallelized N data onto the N global lines.

6. The semiconductor memory device of claim 1, wherein the column address output unit includes:
a column address counter suitable for repeatedly counting each of remaining bits of the internal column address N times, except for the LSB of the internal column address, and outputting a counting address; and an inversion control unit suitable for inverting an LSB of the counting address in response to a completion of the $N^{th}$ counting operation of the column address counter after the internal column address is generated.

7. The semiconductor memory device of claim 1, wherein the column address output unit is suitable for:
generating an N number of the even-numbered column addresses by first counting remaining bits of the internal column address except for the LSB N times, inverting the LSB of the internal column address, and generating an N number of the odd-numbered column addresses by secondly counting the remaining bits of the internal column address N times, when the internal column address has an even-numbered value, and
generating an N number of the odd-numbered column addresses by first counting the remaining bits of the internal column address except for the LSB N times, inverting the LSB of the internal column address, and generating an N number of the even-numbered column addresses by secondly counting the remaining bits of the internal column address N times, when the internal column address has an odd-numbered value.

8. The semiconductor memory device of claim 1, wherein the odd-numbered array region inputs/outputs N data to/from the N first local lines in parallel in response to the odd-numbered column addresses, and
the even-numbered array region inputs/outputs N data to/from the N second local lines in parallel in response to the even-numbered column addresses.

9. A semiconductor system comprising:
a semiconductor memory device wherein the semiconductor memory device includes M data pads and suitable for inputting/outputting 2*N data serialized for each of the M data pads when an external column command and an external column address are received, N and M being positive integers,
a memory bank having an odd-numbered array region suitable for inputting/outputting data through M*N first local lines in response to an odd-numbered column address, and an even-numbered array region suitable for inputting/outputting data through M*N second local lines in response to an even-numbered column address,
a column address generation unit suitable for consecutively generating the odd-numbered and even-numbered column addresses in response to whether the external column address has an even-numbered value or an odd-numbered value, and
M*N global lines coupled in common to the M*N first local lines and the M*N second local lines, suitable for inputting/outputting data, wherein the M*N global lines are separated by N data and coupled to the M data pads;
and a semiconductor controller suitable for controlling an operation of the semiconductor memory device by generating and transferring the external column command and the external column address to the semiconductor memory device,
wherein the semiconductor memory device further comprises a strobe signal generation unit suitable for controlling whether or not to toggle a strobe signal for defining data input/output (I/O) operations of the memory bank in response to the external column command, wherein the strobe signal generation unit consecutively toggles the strobe signal twice at each point in time at which the column address generation unit generates each of the odd-numbered and the even-numbered column address.

10. The semiconductor system of claim 9, wherein the column address generation unit comprises:
a column address decoding unit suitable for generating an internal column address by decoding the external column address; and
a column address output unit suitable for outputting the internal column address as the even-numbered or odd-numbered column address, inverting a least significant bit (LSB) of the internal column address, and outputting the inverted column address as the odd-numbered column address or the even-numbered column address.

11. The semiconductor system of claim 10, wherein the column address output unit comprises:
a column address counter suitable for repeatedly counting each remaining bits of the internal column address M*N times, except for the LSB of the internal column address, and outputting a counting address; and
an inversion control unit suitable for inverting an LSB of the counting address in response to a completion of the $(M*N)^{th}$ counting operation of the column address counter after the internal column address is generated.

12. The semiconductor system of claim 10, wherein the column address output unit is further suitable for:
generating an M*N number of the even-numbered column addresses by first counting the remaining bits of the internal column address except for the LSB M*N times, inverting the LSB of the internal column address, and generating an M*N number of the odd-numbered column addresses by secondly counting the remaining bits of the internal column address M*N times, when the internal column address has an even-numbered value, and
generating an M*N number of the odd-numbered column addresses by first counting the remaining bits of the internal column address except for the LSB M*N times, inverting the LSB of the internal column address, and generating an M*N number of the even-numbered column addresses by secondly counting the remaining bits of the internal column address M*N times, when the internal column address has an odd-numbered value.

13. The semiconductor system of claim 9, wherein:
the odd-numbered array region inputs/outputs M*N data to/from the M*N first local lines in parallel in response to the odd-numbered column addresses, and
the even-numbered array region inputs/outputs M*N data to/from the M*N second local lines in parallel in response to the even-numbered column addresses.

14. The semiconductor system of claim 9, wherein the semiconductor memory device further comprises:
M data output units suitable for serializing M*N data, received in parallel from the M*N global lines, by N data and outputting the serialized M*N data through the M data pads in response to the strobe signal; and
M data input units suitable for parallelizing M*N data received by N data in series through the respective M data pads and loading the parallelized M*N data onto the M*N global lines in response to the strobe signal.

15. The semiconductor system of claim 14, wherein the data output unit is suitable for:
after a read command of the external column command is received,
serializing M*N data, received in parallel from the M*N global lines, by N data in response to a first toggling of the strobe signal and outputting the serialized M*N data through the M data pads, and
serializing M*N data, received in parallel from the M*N global lines, by N data in response to a second toggling of the strobe signal and outputting the serialized M*N data through the M data pads.

16. The semiconductor system of claim 14, wherein the data input unit is suitable for:
   after a write command of the external column command is received,
   parallelizing M*N data, received by N data in series through the M data pads, in response to a first toggling of the strobe signal and loading the parallelized M*N data onto the M*N global lines, and
   parallelizing M*N data, received in series by N data through the M data pads, in response to a second toggling of the strobe signal and loading the parallelized M*N data onto the M*N global lines.

17. The semiconductor system of claim 9, wherein,
   when consecutively transferring a first external column address and a second external column address to the semiconductor memory device,
   the semiconductor controller transfers the first and the second external column addresses to the semiconductor memory device with a first delay interval when both the first and the second external column addresses have the same values, and
   the semiconductor controller transfers the first and the second external column addresses to the semiconductor memory device with a second delay interval longer than the first delay interval when the first and the second external column address have different values from each other.

18. The semiconductor system of claim 17, wherein
   the first delay interval is a minimum time necessary for the memory bank to process one data I/O operation, and
   the second delay interval is a time longer than the first delay interval by at least one cycle (1*tCK) of an operation clock.

* * * * *